(12) United States Patent
Tanaka

(10) Patent No.: US 6,296,747 B1
(45) Date of Patent: Oct. 2, 2001

(54) BAFFLED PERFORATED SHIELD IN A PLASMA SPUTTERING REACTOR

(75) Inventor: Yoichiro Tanaka, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/602,580

(22) Filed: Jun. 22, 2000

(51) Int. Cl.[7] .................................................. C23C 14/34
(52) U.S. Cl. ................. 204/298.07; 204/298.11; 204/298.14
(58) Field of Search .................. 204/298.07, 298.11, 204/298.14

(56) References Cited

U.S. PATENT DOCUMENTS

| | | | |
|---|---|---|---|
| 3,661,758 | * | 5/1972 | Jackson et al. ............... 204/298.14 |
| 5,470,451 | * | 11/1995 | Kobayashi et al. ............ 204/298.07 |
| 5,879,523 | | 3/1999 | Wang et al. .................... 204/298.11 |
| 5,897,752 | | 3/1999 | Hong et al. .................... 204/192.12 |
| 6,022,461 | * | 2/2000 | Kobayashi et al. ............ 204/298.07 |

* cited by examiner

*Primary Examiner*—Rodney G. McDonald
(74) *Attorney, Agent, or Firm*—Charles S. Guenzer

(57) ABSTRACT

A shield assembly for protecting the walls of a plasma sputter reactor from deposition while allowing high flow of processing gas into the processing space of the reactor without the plasma leaking out of the processing space. The shield assembly is particularly useful for reactive sputtering, for example, of TiN or TaN, in which large amounts of nitrogen need to flow into the chamber. The shield assembly includes a primary shield positioned inside of the chamber sidewalls and protecting the sidewalls and preferably also the bottom wall and sides of the pedestal. Multiple holes are formed in the primary shield to pass gas input through a gas inlet in the chamber walls outside of the primary shield. A baffle shield in positioned inside of the primary shield and covers the holes in the primary shield with a gap between the two shields. The baffle shield extends only partway along the primary shield so that gap communicates with the processing space of the reactor. Preferably, both the primary and baffle shield are grounded to no electric field exists in the gap. The shield assembly is particularly useful for magnetron sputter reactors in which an axial magnetic field is generated parallel to the side portions of the primary shield.

18 Claims, 4 Drawing Sheets

BAFFLED PERFORATED SHIELD IN A PLASMA SPUTTERING REACTOR

FIELD OF THE INVENTION

The invention relates generally to plasma sputtering. In particular, the invention relates to chamber parts optimized for supply of gases in plasma sputtering.

BACKGROUND ART

Magnetron plasma sputtering is widely practiced in the semiconductor industry for the deposition of metals and metal compounds. A recently developed technology of self-ionized plasma (SIP) sputtering allows plasma sputtering reactors to be only slightly modified but to nonetheless achieve efficient filling of metals into high aspect-ratio holes. This technology has been described by Fu et al. in U.S. patent application Ser. No. 09/546,798, filed Apr. 11, 2000, and by Chiang et al. in U.S. patent application Ser. No. 09/414,614, filed Oct. 8, 1999, both incorporated herein by reference in their entireties.

Such a reactor 10 is schematically illustrated in cross section in FIG. 2. This reactor is based on a modification of the Endura PVD Reactor available from Applied Materials, Inc. of Santa Clara, Calif. The reactor 10 includes a vacuum chamber 12, usually of metal and electrically grounded, sealed through a target isolator 14 to a sputtering target 16, usually at least a metal surface portion composed of the material to be sputter deposited on a wafer 18. A cover ring 20 shields the portion of a pedestal electrode supporting the wafer 18 between the wafer 18 and its edge. Unillustrated resistive heaters, refrigerant channels, and thermal transfer gas cavity in the pedestal 22 allow the temperature of the pedestal 22 to be controlled within a temperature range extending down to less than −40° C. to thereby allow the wafer temperature to be similarly controlled. However, for the materials being described here, the deposition temperature is typically in the range of 100 to 400° C.

An electrically floating shield 24 and a grounded shield 26 separated by a second dielectric shield isolator 28 are held within the chamber 12 to protect the chamber wall 12 from being coated by the sputtered material. When after extended use the shields 24, 26 are instead coated, they can be quickly replaced by fresh shields. If desired, the coated shields can be refurbished for reuse. The shield replacement eliminates much of the need for cleaning the chamber wall, which consumes valuable production time not only for the cleaning itself but also for reestablishing the high vacuum in the chamber after cleaning fluid has been used on the chamber walls, which would be required in the absence of shields.

The grounded shield 26 includes a downwardly extending outer portion 30, an inwardly extending bottom portion 32 and an upwardly extending inner portion 30 which terminates close to the wafer clamp 20 and to the top of the wafer pedestal with a narrow gap 34 extending from the backside of the pedestal 22 to the main processing area. The grounded shield 26 thereby acts as the anode grounding plane in opposition to the cathode target 16, thereby capacitively supporting a plasma. Some electrons deposit on the floating shield 26 so that a negative charge builds up there. The negative potential not only repels further electrons from the shield but also confines the electrons to the main plasma area, thus reducing the electron loss, sustaining low-pressure sputtering, and increasing the plasma density.

A selectable DC power supply 36 negatively biases the target 16 to about −400 to −600 VDC with respect to the grounded shield 26 to ignite and maintain the plasma. A target power of between 1 and 5 kW is typically used to ignite the plasma while a power of greater than 10 kW is preferred for the SIP sputtering process described below. Conventionally, the pedestal 22 and hence the wafer 18 are left electrically floating, but a negative DC self-bias nonetheless develops on them. On the other hand, some designs use a controllable power supply 38 to apply a DC or RF bias to the pedestal 22 to further control the negative DC bias that develops on it. In the tested configuration, the bias power supply 38 is an RF power supply operating at 13.56 MHz.

A gas source 40 supplies a sputtering working gas, typically the chemically inactive noble gas argon, through a mass flow controller 42 to a gas inlet 44 located at the lower portion of the chamber 12 in back of and below the grounded shield 26. The gas enters the main processing space between the target 16 and the wafer 18 through the gap 34 between the grounded shield 26 and the pedestal 22 and the clamp 20. A vacuum pump system 46 connected to the chamber 12 through a wide pumping port 48 on the side of the chamber opposite the gas inlet 44 maintains the chamber at a low pressure. Although the base pressure can be held to about $10^{-7}$ Torr or even lower, the pressure is typically maintained at about or below 1 milliTorr for SIP sputtering of metals. A computer-based controller 50 controls the reactor including the DC target power supply 36, the bias power supply 38, the mass flow controller 42, and the vacuum system 46.

To provide efficient sputtering, a magnetron 54 is positioned in back of the target 16. It has opposed magnets 56, 58 connected and supported by a magnetic yoke 60. The magnetic field traps electrons and, for charge neutrality, the ion density also increases to form a high-density plasma region 62 close to the target 16. The magnetron 54 is rotated about the center 64 of the target 16 by a motor-driven shaft 66 to achieve full coverage in sputtering the target 16.

To decrease the electron loss, the inner magnetic pole represented by the inner magnet 56 and unillustrated magnetic pole face should be surrounded by a continuous outer magnetic pole represented by the outer magnets 58 and unillustrated pole face. Furthermore, to guide the ionized sputter particles to the wafer 18 and to minimize electron leakage to the grounded shield 26, the magnets 58 of the outer pole should produce a much higher total magnetic flux integrated over the area of the pole face, particularly near its outer portions, than do the magnets 56 of the inner pole. The asymmetric magnetic field lines extend far from the target 16 toward the wafer and at least partially parallel to the grounded shield 26. Such an axial magnetic field traps electrons and extends the plasma closer to the wafer 18. Other means are available for generating such an axial field, such as auxiliary magnets or electromagnetic coils.

The above described sputtering reactor has been very effective at depositing copper into high aspect-ratio holes in the wafer 18. It is possible to sputter copper by self-sustained sputtering (SSS), in which after the plasma has been established, the supply of argon is discontinued and the plasma is supported only by the sputtered plasma ions. The chamber pressure can be reduced essentially to zero. This same chamber has been effective also at depositing aluminum, tungsten, and titanium into such high aspect-ratio holes. Although sustained self-sputtering is not possible with Al and Ti, some of the same mechanisms allow SIP sputtering of these metals at very low pressures and high ionization fractions, thus facilitating deep hole filling.

A variant of the above SIP chamber is described by Fu et al. in U.S. patent application Ser. No. 09/581,180 filed on Mar. 2, 2000, also incorporated herein by reference in its entirely. This chamber uses a complexly shaped target having an annularly shaped vault and magnets disposed along sidewalls of the vault.

Titanium is used as part of a liner layer in vias and contacts to be later filled with aluminum or possibly copper. However, the barrier layer typically also includes a titanium nitride (TiN) layer. For copper metallization, the more usual barrier layer is based on tantalum, often a Ta/TaN bilayer. In either case, the same reactor can be used in the same sequence to deposit both the metal and metal nitride by, in a second portion of the sputter deposition, admitting nitrogen as well as argon into the chamber. The nitrogen reacts with the sputtered metal to form, for example, TiN on the wafer by a reactive sputtering process.

Although Ti/TiN and Ta/TaN have been effectively sputtered in conventional sputtering reactors, the reactive sputtering of TiN or TaN has presented a problem in the SIP reactor of FIG. 1. If nitrogen is similarly admitted to the back of the grounded shield 26, it must pass through the narrow gap 34 to reach the processing area. However, nitrogen unlike argon is consumed in the reactive sputtering process so that it needs to be continually replenished at a rate which is typically greater than that of the inactive argon. That is, a large amount of nitrogen needs to flow through the constricted gap 34 to ensure that the resulting film layer deposited on the substrate is uniformly composed of completely nitride metal, that is, TiN or TaN. It has been found that the conventional gap 34 produces unsatisfactory results in sputter depositing TiN or TaN.

The width of the gap 34 could be increased, but the width would be greater than the maximum width producing a plasma dark space, and therefore the plasma could extend through the enlarged gap and short out the self-biased pedestal 22. It is also possible to provide a separate nitrogen gas inlet directly into the main processing area through the chamber wall 12 and through the middle of the outer portion 30 of the grounded shield 26. While the separate nitrogen inlet would be effective, it introduces substantial design and assembly problems. Furthermore, the localized introduction of large amounts of nitrogen would tend to deposit significant thicknesses of TiN on the grounded shield 26 adjacent to the nitrogen inlet. Excessive thicknesses of TiN flake from the shield and raise particulate levels.

Some efforts have been expended in modifying the grounded shield 26 to include additional apertures in its horizontally extending bottom portion 32 of the grounded shield 26. While bottom shield holes are effective for conventional sputtering reactors, such bottom holes do not work well with the unbalanced magnetron 54 used in SIP. In the unbalanced design, the magnetic field lines are intended to extend far away from the target 16, and they extend vertically even to the bottom 32 of the grounded shield. Electrons are trapped on these magnetic field lines and exit the main processing area through any bottom holes. As a result, the plasma leaks from the main processing area to the back of the pedestal 22. Further attempts have been made to reduce the plasma leakage problem by introducing baffles in front of the bottom holes, but such bottom baffles have not been effective because the magnetic field lines still extend through the bottom holes and the plasma can still leak through the holes despite the baffles.

Accordingly, it is desired to provide means for injecting large amounts of reactive gas into this and other sputtering chambers which provide for injecting large amounts of nitrogen or other reactive gases without excessive deposition on chamber parts next to the gas inlet.

SUMMARY OF THE INVENTION

The invention includes a shield used in a sputter reactor providing high conductance for the flow of processing gas into the chamber while blocking leakage of the plasma through the gas inlet. The invention is particularly useful for reactive sputtering in which a reactive gas such as nitrogen is supplied into the chamber.

The shield includes two nested shields. An outer shield includes a plurality of apertures distributed around a circumference of the outer shield in a portion between the target and the substrate being sputter coated. The outer shield preferably includes a bottom portion extending below the substrate to shield the chamber. An inner shield is separated from the outer shield in the area of the apertures and extends only partway downwardly, thereby forming a gap between the two shields for the flow of the processing gas from behind the shield into the processing space in front of the shield. The inner shield acts as a baffle for the perforated outer shield.

The invention is advantageously used with a magnetron having an unbalanced magnetron above the target or other means which create a magnetic field extending axially in the chamber and at least partially parallel to the gas flow apertures.

Both shields are preferably held at a common electrical potential, for example, are both grounded.

DETAILED DESCRIPTION OF THE PREFERRED EMBODIMENT

Figure 2:
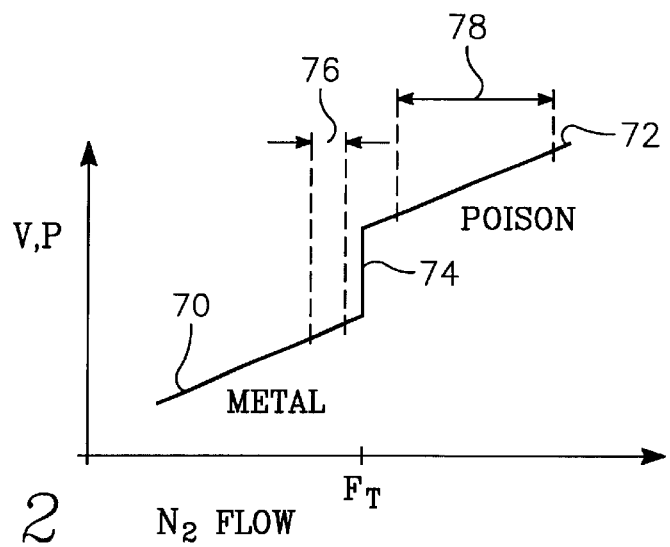
FIG. 2 is a graph illustrating the transition between two modes of deposition in reactive sputtering.

In the reactive sputtering of TiN and other compound materials, it is highly desirable that at least the nitrogen or other reactive gas flow into the chamber through a high conductance path. It has been recognized that TiN sputtering can be operated in two modes, dependent upon the flow of nitrogen, as illustrated in the schematic graph of FIG. 2. The different modes can be monitored by measuring the chamber pressure P or the target voltage V at a fixed target power, but the modes are fundamentally determined by the condition of the target surface. A metal mode of sputtering occurs at low nitrogen flow 70. In metal mode, the argon working ions keep the surface of the target clean and metallic. Whatever nitriding of the target occurs from the limited amount of nitrogen is quickly cleaned away. Therefore, only metal atoms or ions are sputtered from the target, and they react with the nitrogen principally at the wafer surface. Poison mode, on the other hand, occurs at higher nitrogen flow 72. In poison mode, there is sufficient nitrogen in the chamber to nitride the target to a sufficient thickness that the argon ions cannot remove. The argon ions can still sputter the target surface, but some composition of titanium nitride is being sputtered. The sputtered titanium nitride still deposits on the wafer surface, but the reaction between the metal and the nitrogen is likely to have occurred prior to deposition. As a result, the TiN films deposited by metal and poison modes are significantly different.

A flow transition 74 between the metal and poison modes occurring at the nitrogen flow $F_T$, assuming constant argon flow, can be very sharp if there is reasonable gas conductance into the chamber. Although metal mode is sometimes preferred for its high deposition rate, operationally it is often advantageous to operate in poison mode, that is, with the nitrogen flow above $F_T$. Generally, it is desired to operate with a large nitrogen flow in order to provide sufficient flow of nitrogen over the wafer to assure complete nitridation, thereby increasing the uniformity of film resistivity. Metal mode therefore suffers a relatively narrow nitrogen flow process window 76 that is limited on the lower side by the need for a sufficient nitrogen flow and on the upper side by the mode transition 74. On the other hand, poison mode enjoys a relatively wide process window 76 that can be placed at a range of flows larger than the flow transition $F_T$. The window is substantially unlimited on the upper end.

The transition flow $F_T$, measured for example in standard cubic centimeters per minute (sccm) of nitrogen, depends upon the flow conductance for the nitrogen. For a high conductance path, the transition $F_T$ occurs at relatively low nitrogen flow. For a low conductance path, the transition $F_T$ occurs at relatively high nitrogen flow and may not even occur at usable flows. Therefore, a low flow transition and a high nitrogen conductance path are desirable particularly when operation in poison mode is desired.

Figure 1:
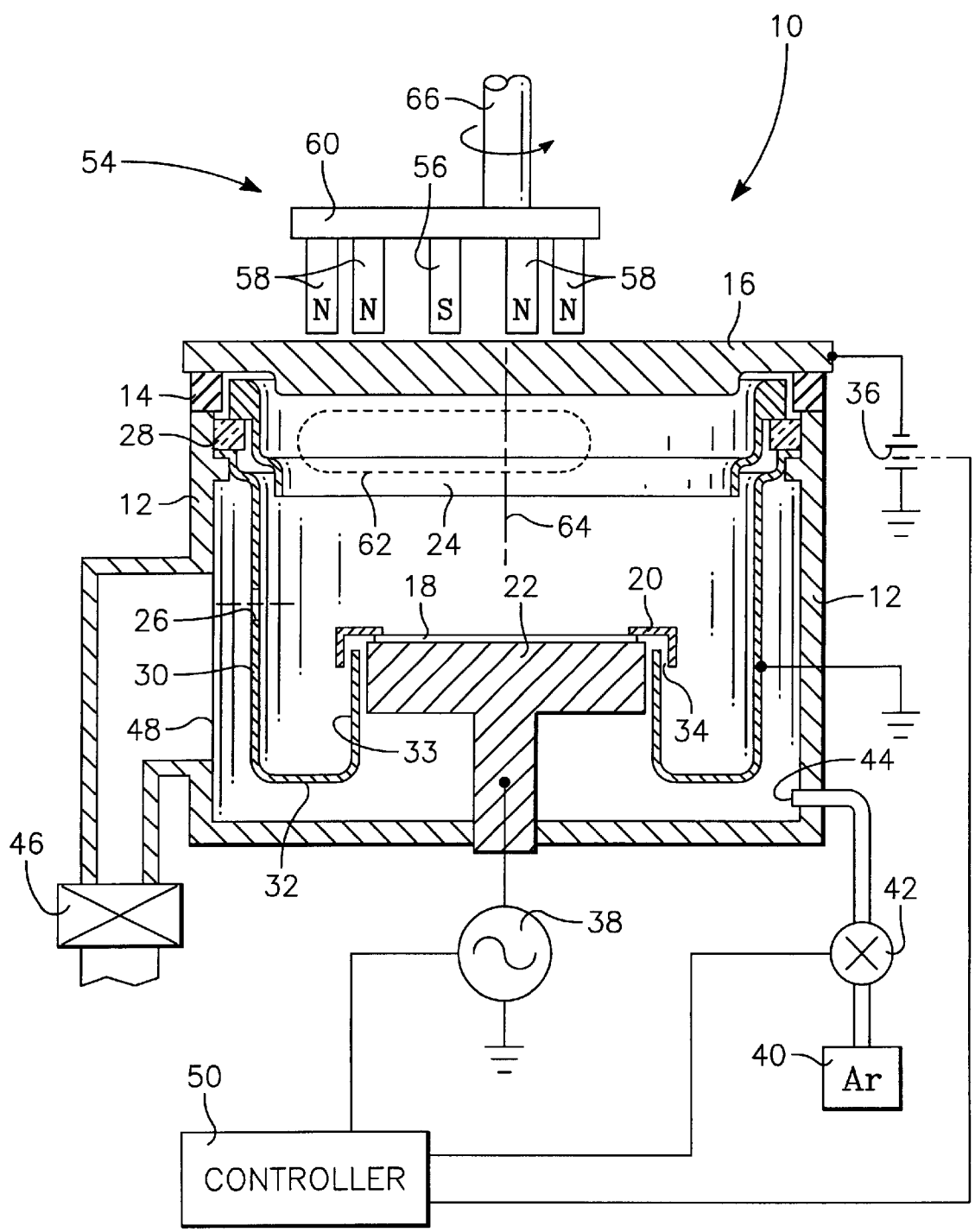
FIG. 1 is a schematic cross-sectional view of a sputter reactor capable of self-ionized plasma (SIP) sputtering.
Figure 3:
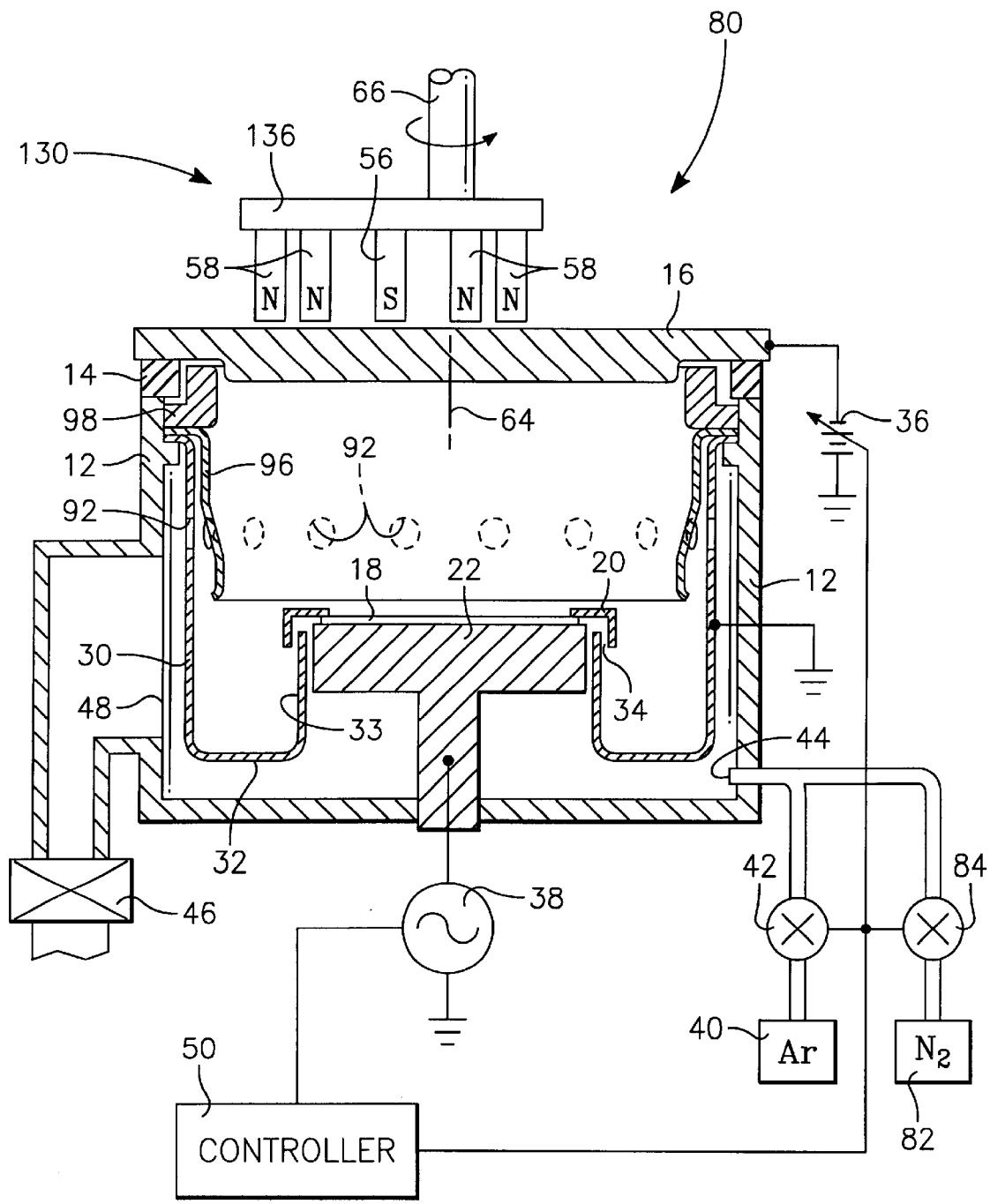
FIG. 3 is a schematic cross-sectional view of a reactor incorporating the perforated shield of the invention.

A sputter reactor incorporating a high conductance flow path is illustrated in the schematic cross-sectional view of FIG. 3. Nitrogen is supplied from a gas source 82 through a mass flow controller 84 to the same gas inlet 44 used for the argon. A grounded lower, perforated shield 90 is similar to the grounded shield 26 of FIG. 1, but it includes multiple holes 92 in its outer descending section 30 arranged circumferentially in back of (radially outwardly from) and spaced from an electrically grounded inner shield 96. An electrically grounded upper shield 98 is separated from the target by a dark-space gap.

Figure 4:
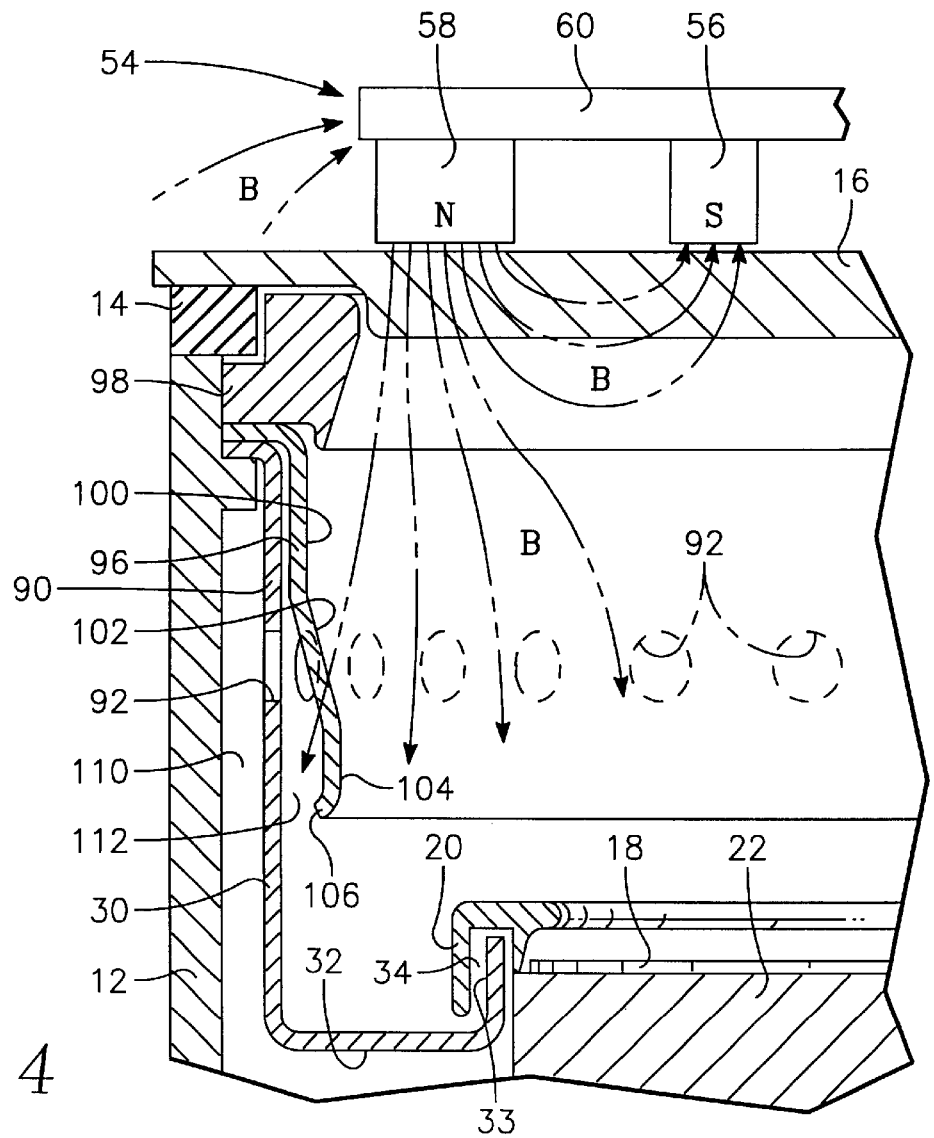
FIG. 4 is a detailed cross-sectional view of portions of the shields of the invention.
Figure 5:
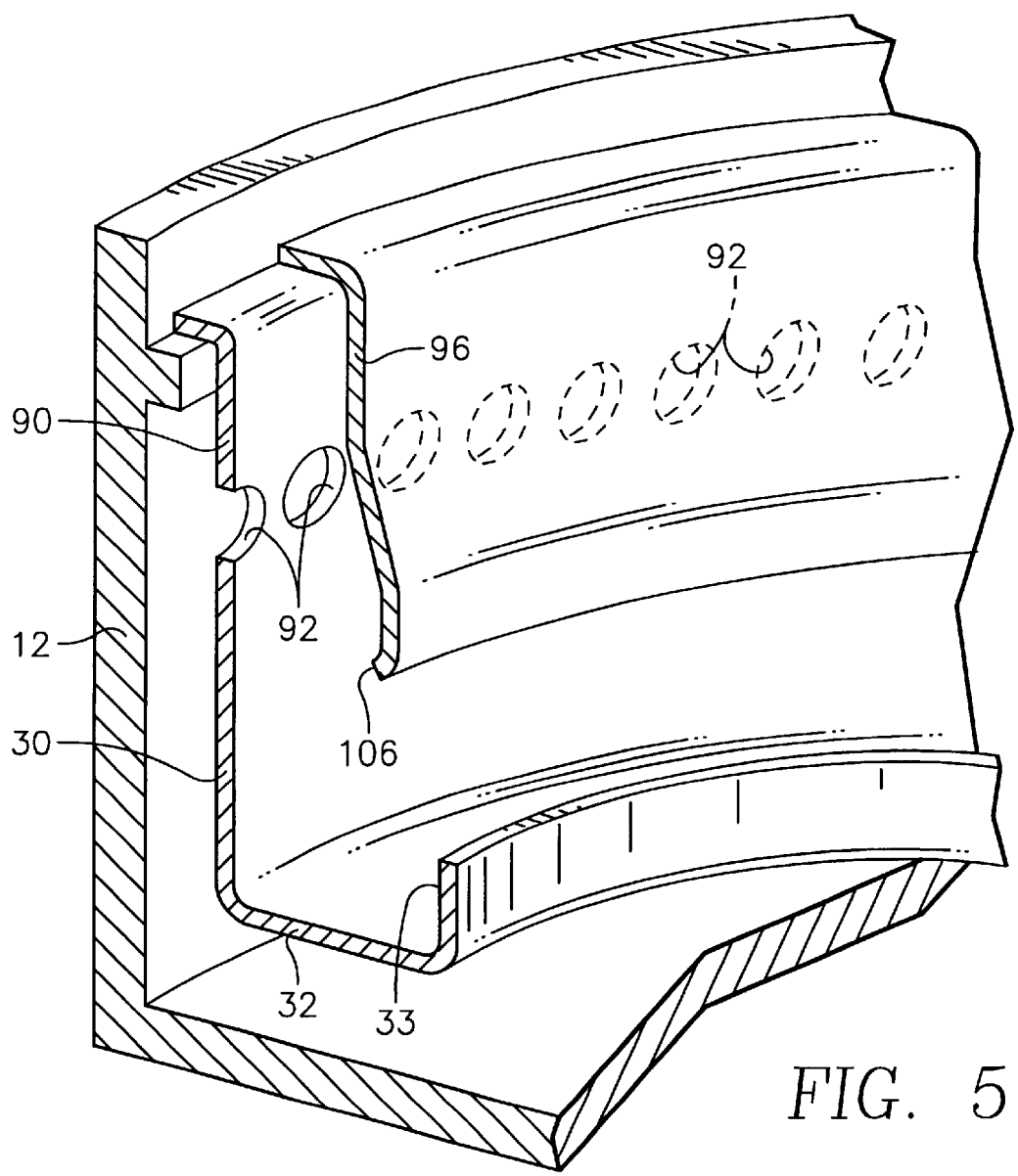
FIG. 5 is a partially sectioned orthographic view of the baffled grounded shield mounted in a sputter chamber.

The generally circularly symmetric shields 90, 96, 98 are shown in more detail in the cross-sectional view of FIG. 4 including the associated parts of the chamber. A partially sectioned orthographic view is presented in FIG. 5 for the lower and inner shields 90, 96 mounted to the chamber 12. Both the lower grounded shield 90 and the inner shield 96 are preferably composed of a metal such as stainless steel. They are both supported at their upper ends on the grounded chamber wall 12 by respective outwardly extending flanges. Unillustrated fastening means such as screws secure the conductive shields 90, 92, 98 to each other and to the grounded chamber wall 12, thereby grounding all the shields 90, 92, 98. An alternative design replaces the grounded upper shield 98 with a floating shield, such as the shield 24 illustrated in FIG. 1.

The lower shield 90 includes the outer downwardly extending portion 30, the bottom radially extending portion 32, and the inner upperwardly extending portion 33, which is separated by respective gaps from the wafer shield 20 and the wafer pedestal 22. The inner shield 96 is disposed radially inside of the lower shield 90 and includes an upper cylindrical portion 100, an inwardly tapering portion 102, and a lower cylindrical portion 104. The larger diameter of the upper cylindrical portion 100 of the inner shield 96 relative to its lower cylindrical portion 104 provides only a minimal gap next to the lower shield 90, but it moves the grounded inner shield radially outwardly from the biased target 16 to thereby reduce the maximum potential gradient between the target 16 and inner shield 96, to thereby more efficiently direct the plasma toward the lower portion of the chamber. A small rim 106 may be formed on the bottom of the lower cylindrical portion 104 to provide mechanical rigidity.

The holes 92 are preferably formed in the lower shield 90 behind the taper section 102 of the inner shield 96 although a somewhat lower position in back of the lower cylindrical portion 104 would provide high flow conductance with little opportunity for plasma leakage. Processing gas including the reactive nitrogen initially flows into an outer cylindrical manifold 110 formed between the lower shield 90 and the chamber wall 12. From there, the gas flows through the holes 92 in the lower shield 90 and then downwardly through a wide gap 112 of a few centimeters formed between the descending portion 30 of the lower shield 90 and the lower cylindrical portion 104 of the inner shield 96 before flowing into the processing space between the target 16 and the wafer 18 on the pedestal 22. Thus, the inner shield 96 acts as a baffle for processing gas flowing through the holes 92 in the lower shield 90 and into the processing space. In an exemplary design, 30 to 40 holes having diameters of about 15 mm are evenly spaced about a circumference. The hole sizes may range from 2 mm to 25 mm. The smaller sizes require an increased number of holes. If the hole size is much smaller than 2 mm, the hole conductance is too low; larger than 25 mm, the holes may allow the plasma to leak through.

Because both the lower shield 90 and the inner shield 96 are grounded, essentially no electric field exists in the gap 112 between them. Therefore, the plasma is not likely to leak from the processing area out through the holes 92. Furthermore, the magnetic field B has flux lines in the vicinity of the holes 92 which are parallel to the plane of the holes 92. The electrons tend to be trapped on the magnetic field lines, and thus the magnetic field acts as a barrier against the leakage of electrons through the holes 92. In contrast, if large holes for the processing gas were placed in the bottom portion 32 of the lower shield 90, the magnetic field would extend perpendicularly through the holes and support the leakage of the plasma electrons through the holes.

The high conductance shield assembly described above has been tested in the sputter deposition of TiN. A small-area circular magnetron was rotated about the back of the target, and 18 kW of DC power was applied to the target while RF power at 13.56 MHz biased the pedestal. The chamber pressure was maintained at 3 to 4 milliTorr. The flow of argon was maintained at 16 sccm, but the nitrogen flow was varied. The transition to poison mode occurred at a flow of nitrogen of between 70 and 80 sccm. In comparison, with the same reactor operating conditions, poison mode operation was not obtained with a conventional shield even with a nitrogen flow of 100 sccm.

Although the invention has been described as being particularly useful for reactive sputtering at relatively low pressures and with unbalanced magnetrons, the high conductance paths afforded by the invention are useful for simplifying the flow path into the processing areas of other reactors and sputter deposition processes.

The invention thus provides, with only minimal increase in chamber complexity, a high conductance path for the flow of processing gas, particularly reactive processing gas, into the chamber while still preventing plasma leakage out of the chamber. Thereby, the plasma can be effectively confined to the chamber without electron loss.

What is claimed is:

1. A plasma sputtering reactor, comprising:
   a vacuum chamber including side chamber walls;
   a target disposed on one side of a processing space disposed between said side chamber walls;
   a pedestal for supporting a substrate to being sputter coated with a material of said target and being disposed within said vacuum chamber on an opposite side of said processing space from said target;
   a first shield surrounding sides of said processing space and disposed inside of said side chamber walls, said first shield including a plurality of apertures in portions of said shield extending between said target and said pedestal; and
   an inlet for a processing gas disposed in said side chamber walls on a side of said first shield opposite said processing space and injecting said processing gas into an injection space defined between said side chamber walls and said first shield.

2. The reactor of claim 1, wherein said first shield is grounded.

3. The reactor of claim 2, further comprising a DC power supply connected to said target.

4. The reactor of claim 3, further comprising a bias power supply connected to said pedestal.

5. The reactor of claim 1, further comprising magnetic means for generating a magnetic field adjacent to said target and extending at least partially axially in said chamber in an area of said apertures.

6. The reactor of claim 5, wherein said means includes a magnetron positioned at a back of said target.

7. The reactor of claim 1, further comprising a second shield extending only part ways along side portions of said first shield including said apertures and disposed between said side portions and said processing space with a gap between said second shield and said side portions.

8. The reactor of claim 7, wherein said first and second shields are annular about a central axis of said chamber.

9. The reactor of claim 7, wherein a space is defined between said first and second shields that is closed on a side toward said target and open on a side toward said pedestal.

10. The reactor of claim 7, wherein said first and second shields are held at a common potential.

11. The reactor of claim 10, wherein said first and second shields are electrically grounded to said side chamber walls.

12. The reactor of claim 11, further comprising an electrically grounded third shield disposed between said first shield and said target.

13. The reactor of claim 11, further comprising an electrically floating shield disposed inside of said second shield towards said processing space and extending only partway from said target toward an end of said second shield opposite said target.

14. The reactor of claim 1, wherein said apertures are disposed around a circumference of said processing space.

15. The reactor of claim 1, wherein said first shield includes an outer portion in which said apertures are formed and which extends vertically inside said side chamber walls with a space therebetween, a bottom portion extending horizontally from said outer portion toward said pedestal in an area in back of a substrate support surface of said pedestal, and an inner portion extending vertically from said bottom portion alongside said pedestal.

16. A shield assembly configured to be supported in a sputter reactor, comprising:
   a first generally circularly symmetric shield supportable on sidewalls of said sputter reactor and including
      a first side portion of a first diameter protecting said sidewalls from being sputter coated and including a plurality of circumferentially arranged apertures therethrough, and
      a bottom portion protecting a bottom wall of said sputter reactor from being sputter coated; and
   a second generally circularly symmetric shield supportable on said sidewalls and including a second side portion of a second diameter less than said first diameter and axially extending less of a distance than said first side portion,
   whereby a gas flow channel into a processing space of said sputter reactor is formed through said apertures and through a gap between said first and second side portions.

17. The shield assembly of claim 16, wherein said first shield additionally includes an inner portion of a third diameter less than said second diameter and connected to said bottom portion to protect sides of a substrate support from being sputter coated.

18. A perforated metallic shield assembly configured to be positioned inside a plasma sputtering reactor, comprising a metallic member and a baffle shield;
   said metallic member being generally circularly symmetric about an axis and having:
      a flange portion extending radially outwardly from said axis;
      a side portion connected on a top end thereof to an inner end of said flange portion, extending downwardly along said axis, and including a plurality of apertures arranged about said axis in a middle part of and extending through said side portion;
      a bottom portion connected on an outer end thereof to a bottom end of said side portion and extending radially inwardly toward said axis; and
      an inner portion connected on a bottom end thereof to an inner end of said bottom portion and extending upwardly along said axis;
   said baffle shield comprising a second metallic member generally circularly symmetric about said axis and having a wall portion fittable between said side portion of said perforated shield and positionable to extend from said top end top of said side portion of said perforated shield and to terminate at an axial position between said apertures and said bottom end of said side portion.

* * * * *